United States Patent
Ramet et al.

(10) Patent No.: US 6,822,520 B2
(45) Date of Patent: Nov. 23, 2004

(54) LOW NOISE LOAD PUMP FOR PHASE-LOCKING LOOP

(75) Inventors: Serge Ramet, Grenoble (FR); Sébastien Rieubon, Echirolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/204,170

(22) PCT Filed: Dec. 28, 2001

(86) PCT No.: PCT/FR01/04224
§ 371 (c)(1),
(2), (4) Date: Oct. 15, 2002

(87) PCT Pub. No.: WO02/054597
PCT Pub. Date: Jul. 11, 2002

(65) Prior Publication Data
US 2003/0062958 A1 Apr. 3, 2003

(51) Int. Cl.$^7$ ................................................ H03L 7/06
(52) U.S. Cl. ........................ 331/17; 327/157; 327/159
(58) Field of Search .............................. 331/17, 16, 15; 327/157, 159, 148, 534, 112, 111

(56) References Cited

U.S. PATENT DOCUMENTS

| | | | | |
|---|---|---|---|---|
| 5,166,641 A | * | 11/1992 | Davis et al. ................ 311/1 A |
| 5,508,660 A | * | 4/1996 | Gersbach et al. ............. 331/17 |
| 6,107,849 A | * | 8/2000 | Williams et al. ............ 327/157 |
| 6,124,755 A | * | 9/2000 | Parker et al. ................ 327/543 |
| 6,229,362 B1 | * | 5/2001 | Choi .......................... 327/157 |

FOREIGN PATENT DOCUMENTS

FR   2754959 A1   *   4/1998   ............ H03L/7/10

* cited by examiner

Primary Examiner—Benny Lee
Assistant Examiner—Joseph Chang
(74) Attorney, Agent, or Firm—Lisa K. Jorgenson; William R. McClellan; Wolf, Greenfield & Sacks, P.C.

(57) ABSTRACT

The invention concerns a load pump for phase-locking loop comprising a first current source (14), a second current source (16), several switches (M1, M2, M3, M4) adapted to communicate the first and/or the second current source with the load pump output (OUT). The second current source is driven by control means (18) adapted to store a physical quantity corresponding to the value of the current (11) supplied by the first current source (14), so that the value of the current (12) supplied by the second current source is substantially equal to the value of current (11) supplied by the first current source.

8 Claims, 2 Drawing Sheets

LOW NOISE LOAD PUMP FOR PHASE-LOCKING LOOP

BACKGROUND OF THE INVENTION

The present invention relates to phase-locked loops, and in particular to the charge pumps used in some phase-locked loops.

1. Field of the Invention

FIG. 1 shows a conventional phase-locked loop, including a charge pump 1. A reference frequency Fref coming from a quartz oscillator is applied to a frequency divider 3. Frequency divider 3 is a divider by R and it provides a signal Fdiv having a frequency equal to Fref/R. Signal Fdiv is provided to a phase comparator 5. Phase comparator 5 also receives a signal Fcomp, the frequency of which corresponds to frequency Fvco of the output signal of the phase-locked loop, divided by a predetermined number N. Phase comparator 5 compares the phases of signals Fdiv and Fcomp. Phase comparator 5 transmits a positive pulse on an output U if signal Fdiv is ahead of signal Fcomp, and a positive pulse on an output D if signal Fcomp is ahead of signal Fdiv. The signals coming from outputs U and D of the phase comparator are provided to charge pump 1. Charge pump 1 drives a loop filter 7.

2. Discussion of the Related Art

Charge pump 1 includes a first current source 6A providing a current I1. Current source 6A is coupled to output OUT of the charge pump via a switch Sa. Switch Sa is controlled by signal U provided by the phase comparator. When signal U is high, switch Sa is on and current I1 is provided by the charge pump to loop filter 7. The charge pump includes a second current source 6B run through by a current I2. Current source 6B is coupled to the charge pump output via a switch Sb. Switch Sb is controlled by signal D provided by phase comparator 5. When signal D is high, switch Sb is on and current I2 is absorbed by the charge pump from loop filter 7.

Loop filter 7 outputs a control voltage Uc. Voltage Uc controls a voltage-controlled oscillator 9. Oscillator 9 provides a signal of frequency Fvco, at the output of the phase-locked loop. The output of oscillator 9 drives a frequency divider 11. Frequency divider 11 divides frequency Fvco by N and provides signal Fcomp to phase comparator 5.

The operation of the phase-locked loop is the following.

To simplify, loop filter 7 will be considered to be only formed of a capacitor Cf connected between the charge pump output and the ground, control voltage Uc being the voltage across capacitor Cf. If the rising edge of signal Fdiv occurs before the rising edge of signal Fcomp, output U of the phase comparator switches high. Switch Sa then turns on and current I1 charges capacitor Cf of loop filter 7. The charge of capacitor Cf occurs during the on time $\Delta t$ of switch Sa. In principle, duration $\Delta t$ is equal to the time interval separating the rising edges of signals Fdiv and Fcomp. The charge stored by capacitor Cf thus increases by $I1.\Delta t$, and control voltage Uc increases. Accordingly, voltage-controlled oscillator 9 provides a signal of higher frequency Fvco and the interval between the phases of signals Fdiv and Fcomp decreases. At equilibrium, signals Fdiv and Fcomp have a same phase. The frequency provided by voltage-controlled oscillator 9 then is at the desired value Fvco= Fref.(N/R). Strictly speaking, the phases of signal Fdiv and Fcomp are equal, plus the static phase deviation (it should be reminded that the static interval is the phase deviation exhibited by the phase-locked loop when said loop is stabilized, this phase deviation generally causing no charge variation in loop filter 7). It is here assumed that the static phase deviation is sufficiently low to be neglected.

Conversely, if the frequency provided by oscillator 9 is too high, the rising edge of signal Fcomp occurs before the rising edge of signal Fdiv. A positive pulse on terminal D then turns switch Sb on for a time $\Delta't$, in principle equal to the time interval between the occurrence of the rising edges of signals Fcomp and Fdiv. Current I2 discharges capacitor Cf, its amount of charge decreasing by $I2.\Delta't$. Voltage Uc decreases and the output frequency of oscillator 9 decreases. At equilibrium, the phase-locked loop is stabilized and the phases of signals Fdiv and Fcomp are the same.

The previously-described operation is defective in the case where the pulses on terminals U or D are very short. Indeed, the time necessary to operate switches Sa or Sb may appear to be greater than the duration of the pulse generated by the phase comparator. In this case, switches Sa or Sb do not have time to turn on and do not fulfil their function. A solution to this problem consists of turning on controlled switch Sa or Sb for a longer time, and of turning on, at the same time, the other switch, as illustrated in the diagrams of FIGS. 2a to 2e.

FIGS. 2a to 2e illustrate the case where frequency Fvco is smaller than what is desired. In this case, the rising edge of signal Fdiv (FIG. 2a) occurs at a time t1 prior to time t2 at which occurs the rising edge of signal Fcomp (FIG. 2b). Signal U switches high at time t1, but, as can be seen on the timing diagram illustrating signal U (FIG. 2c), signal U remains high after time t2, and this until a time t3. During time t3–t2, signal D (FIG. 2d) also switches high, which turns on switch Sb. In duration t3–t2, loop filter 7 is run through by a current I1–I2 (FIG. 2e) and capacitor Cf receives a small amount of electric charge equal to $(I1-I2)\times(t3-t2)$. Difference I1–I2, which is positive or negative, is a residual intensity resulting from technological disparities having an effect on current sources 6A and 6B. Duration t3–t2 is selected to be sufficient for each of switches Sa and Sb to have time to turn on during this time. Thus, even when duration t2–t1 is very short, switches Sa or Sb have in all cases time to turn on and the charge pump can satisfactorily inject (respectively sample) current I1 (respectively I2).

At equilibrium, as shown in FIGS. 2a to 2e after time t'0, signals Fdiv and Fcomp are in phase. Their rising edges both appear at time t'1. Signals U and D both switch high at time t'1 and remain high until time t'3. Duration t'3–t'1 is equal to duration t3–t2. As can be seen in FIG. 2e, at equilibrium, output current Iout of the charge pump is equal to difference I1–I2. This difference causes a misadjustment of the frequency of oscillator 9 that the loop will attempt to compensate by generating a static phase shift, which results, in the power spectrum of the output signal of the phase-locked loop, in a undesirable noise in the form of lines.

Further, the phase-locked loop exhibits a passband, determined by loop filter 7. In this passband, the charge pump noise dominates, and it is desirable to decrease it.

Further, charge pumps of prior art have a heavy consumption and take up a relatively large space.

SUMMARY OF THE INVENTION

An object of the present invention is to provide a charge pump for a phase-locked loop such that the noise due to the pump is very attenuated.

Another object of the present invention is to provide a charge pump in which errors due to technological dispersions are avoided.

Another object of the present invention is to provide a charge pump enabling use of smaller components and enabling better integration.

Another object of the present invention is to provide a low-consumption charge pump.

To achieve these and other objects, the present invention provides a charge pump for a phase-locked loop including a first current source, a second current source, several switches adapted to enabling communication of the first and/or the second current source with the charge pump output. The second current source is controlled by a control means adapted to storing a variable corresponding to the value of the current provided by the first current source, so that the value of the current provided by the second current source is substantially equal to the value of the current provided by the first current source, the control means comprising a first branch comprising a first storing means and a second branch comprising a second storing means.

According to an embodiment of the present invention, the control means stores said variable little before enabling communication of the first and/or of the second current source with the charge pump output.

According to an embodiment of the present invention, the first current source is connected between a first supply voltage and a first node, and the switches include:
a first switch connected between the first node and the charge pump output, controlled by a first control signal,
a second switch connected between the first node and a second node, controlled by the inverse of the first control signal,
a third switch connected between the output of the charge pump and a third node, controlled by a second control signal,
a fourth switch connected between the second node and the third node, controlled by the inverse of the second control signal; and the second current source is connected between the third node and a second supply voltage.

According to an embodiment of the present invention, the first branch includes a first capacitor coupled to the second node.

According to an embodiment of the present invention, the second branch includes a fifth switch connected between the second node and the output of the control means.

According to an embodiment of the present invention, the second branch includes a second capacitor coupled to the second node via the fifth switch.

According to an embodiment of the present invention, the second current source is formed by a first MOS-type transistor of a first conductivity type.

According to an embodiment of the present invention, the first current source is formed by a second transistor, of a second conductivity type, and belongs to a current mirror, the current running through the first current source being equal to α times the value of a reference current of the current mirror, with α greater than one.

According to an embodiment of the present invention, the first switch is formed of a third transistor of the second conductivity type, the second switch is formed of a fourth transistor of the second conductivity type, the third transistor is formed of a fifth transistor of the first conductivity type, and the fourth transistor is formed of a sixth transistor of the first conductivity type.

According to an embodiment of the present invention, the first supply voltage is a positive voltage, the second supply voltage is the ground voltage, and the transistors of the first conductivity type are N-channel MOS transistors and the transistors of the second conductivity type are P-channel MOS transistors.

The foregoing and other objects, features and advantages of the present invention will be discussed in detail in the following non-limiting description of specific embodiments in connection with the accompanying drawings, in which:

DETAILED DESCRIPTION

Figure 1:
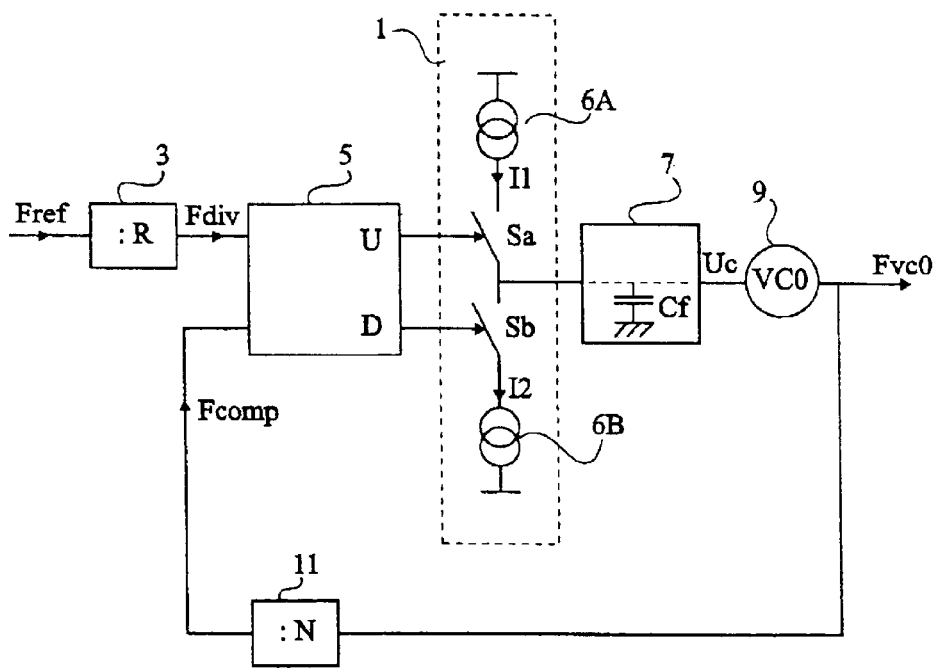
FIG. 1 shows a conventional phase-locked loop including a charge pump.
Figure 2:
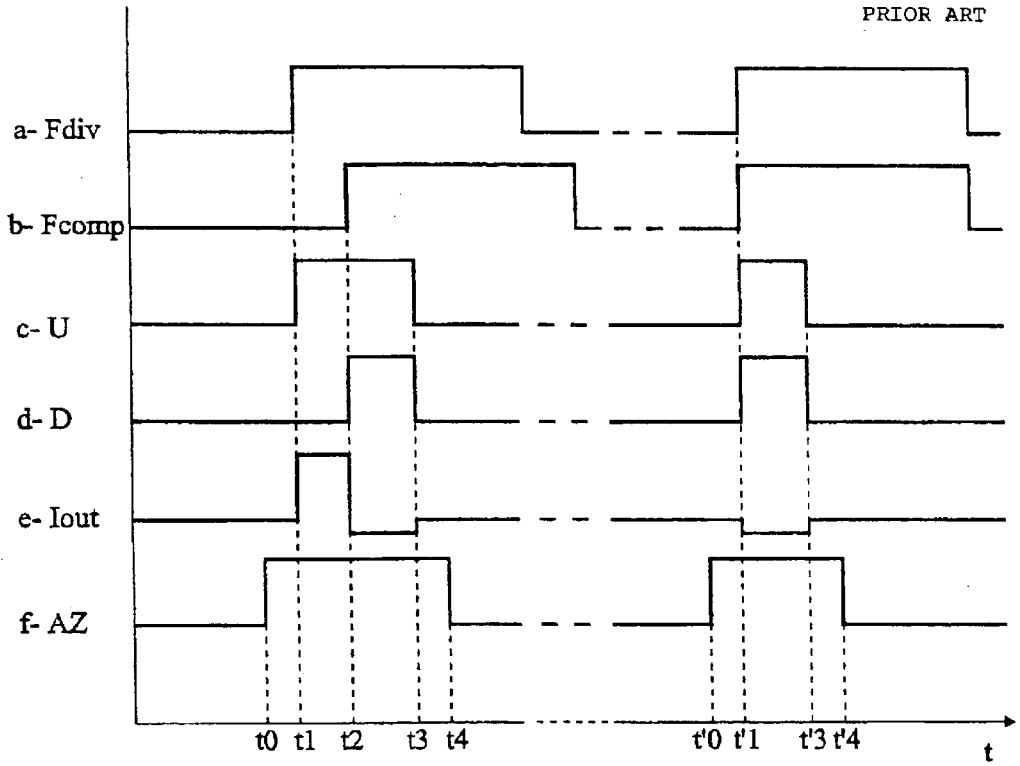
FIGS. 2a to 2e show timing diagrams illustrating the operation of the phase-locked loop of FIG. 1
FIG. 2f shows a timing diagram illustrating the operation of a charge pump according to the present invention.
Figure 3:
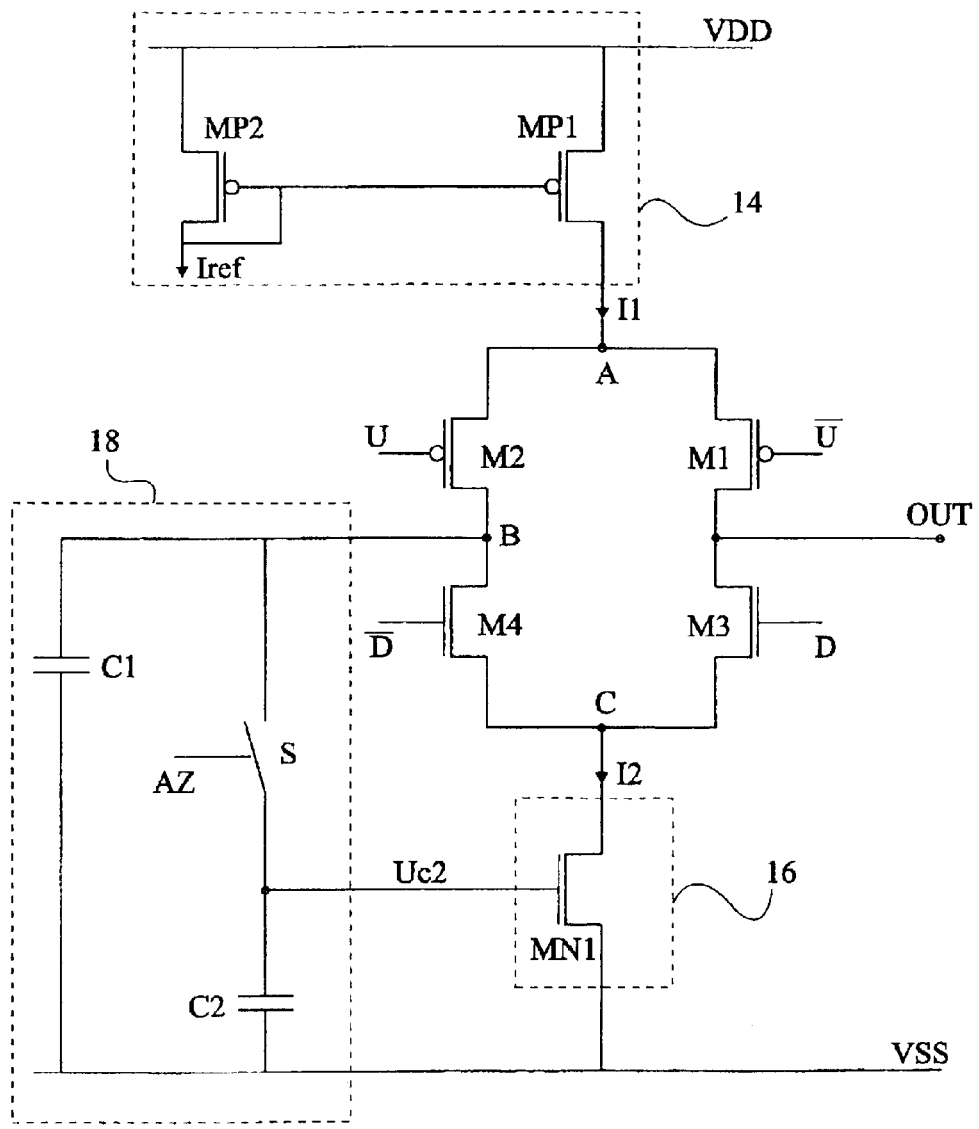
FIG. 3 shows a specific embodiment of the present invention.

In FIG. 3, same references designate same elements as in FIGS. 1 and 2.

FIG. 3 shows an embodiment of a charge pump for a phase-locked loop according to the present invention. The charge pump is supplied by a first supply voltage VDD and a second supply voltage VSS. In the embodiment shown, voltage VSS is the ground voltage (0 volt) and voltage VDD is a positive voltage with respect to the ground.

The charge pump includes a current source 14 arranged between supply voltage VDD and a node A of the charge pump. Current source 14 provides a charge current I1, intended for supplying a loop filter connected at the output of the charge pump when a control signal U provided by a phase comparator located upstream of the charge pump is equal to 1.

In the shown embodiment, current source 14 includes a PMOS transistor MP1 having its source connected to voltage VDD and its drain connected to node A. Transistor MP1 is run through by a current I1. The gate of transistor MP1 is connected to the gate of a PMOS transistor MP2. The source of transistor MP2 is connected to voltage VDD. The drain of transistor MP2 is connected to the gate of transistor MP2. Transistor MP2 is run through by a reference current Iref. Current source 14 is thus formed by means of a current mirror. Advantageously, reference current Iref will not be chosen to be equal to I1, but the geometry of transistors MP1 and MP2 will be chosen so that current I1 is equal to α.Iref, with α greater than 1. Thus, the consumption and the surface of the charge pump will be decreased.

A first pair of switches is connected to node A, each switch being formed of a PMOS transistor, respectively M1 and M2. Transistor M1 has its source connected to node A and its drain connected to output OUT of the charge pump. The gate of transistor M1 is controlled by a signal $\overline{U}$, corresponding to the inverse of signal U provided by the phase comparator. When $\overline{U}$ is equal to "0" (U=1), transistor M1 is on. Transistor M2 has its source connected to node A and its drain connected to a node B of the charge pump. The gate of transistor M2 is controlled by signal U coming from the phase comparator. Transistor M2 is on when signal U is low (U=0). Inverse signals U and $\overline{U}$ must partially overlap to ensure a continuous conduction of current source 14.

A second pair of switches, formed of two transistors M3 and M4, is connected to node B and to output OUT. Transistor M3 is an NMOS transistor, having its drain connected to output OUT and its source to a node C of the charge pump. The gate of transistor M3 is controlled by output D of the phase comparator. Transistor M3 is on when signal D is high (D=1). Transistor M4 is an NMOS transistor, having its drain connected to node B and its source connected to node C. The gate of transistor M4 is controlled by a signal $\overline{D}$, which is the inverse of signal D. Inverse signals D and $\overline{D}$ must partially overlap to ensure a continuous conduction of current source 14.

The state of transistors M1 to M4 according to the values of U and D can be summed up in the two following tables:

| Transistor | U = 1 | U = 0 |
|---|---|---|
| M1 | on | off |
| M2 | off | on |

| Transistor | D = 1 | D = 0 |
|---|---|---|
| M3 | on | off |
| M4 | off | on |

A second current source 16 is arranged between node C and the second supply voltage VSS. Current source 16 is a controllable current source. Current I2 flowing therethrough is a function of a control signal UC2 provided to a control terminal of source 16.

In the shown embodiment, source 16 is formed of an NMOS transistor MN1, having its drain connected to node C and its source connected to voltage VSS. The gate of transistor MN1 receives control signal UC2. In the shown embodiment, control signal UC2 is a voltage signal. Voltage UC2 corresponds to the voltage between the gate and the source of transistor MN1. Transistor MN1 is run through by current I2. Since, in a MOS transistor in saturated state, the value of the drain current is, at the first order, biuniquely linked to the value of the gate-source voltage, discharge current I2 biuniquely depends on control voltage UC2.

The control terminal of current source 16 is driven by a control circuit 18 providing voltage UC2. In the shown embodiment, circuit 18 includes a first branch formed of a capacitor C1 connected between node B and supply voltage VSS. Circuit 18 includes a second branch, also connected between node B and supply voltage VSS, including a switch S connected in series with a capacitor C2. Switch S is connected between node B and the output of circuit 18 providing voltage UC2. Capacitor C2 is connected between the output of circuit 18 and second supply voltage VSS. Switch S is controlled by a signal AZ. Switch S is off (node B isolated form the output of circuit 18) when signal AZ is equal to 1. Switch S is on (node B in communication with the output of circuit 18) when signal AZ is equal to 0.

To explain the operation of the charge pump according to the present invention, reference will be made to the timing diagrams of FIG. 2, in which, in addition to the signals used to explain the operation of the charge pump of prior art, signal AZ is shown (FIG. 2f).

In a first phase, reaching time t0, U=D=0. Signal AZ is also equal to 0. The only on transistors of the pairs of switches are transistors M2 and M4. Switch S is on and node B communicates with the output of circuit 18. Transistors M1 and M3 being off, no current transits through output OUT. Current I1 reaching node A runs through transistor M2 and reaches node B. First, a portion of current I1 is used to charge capacitor C1 and, via on switch S, capacitor C2. The portion of current I1 which has not been used to charge capacitors C1 and C2 crosses transistor M4 and transistor MN1. At equilibrium, capacitors C1 and C2 are charged and absorb no current. Accordingly, current I1 provided by current source 14 entirely crosses current source 16 and, thereby, current source 16 is run through by a current I2 strictly equal to current I1. This last point is particularly important. Indeed, in prior art, even if it was tried to have identical current sources 6A and 6B, technological dispersions would result in that, as seen, current I1 is never strictly equal to I2.

At time t0, little before occurrence of the rising edge of signal Fdiv at time t1 (it should be reminded that FIG. 2 shows the case where signal Fdiv is ahead of signal Fcomp, but the reasoning is similar and can be readily deduced in the case where signal Fcomp is ahead of signal Fdiv), signal AZ switches to "1" and switch S turns off. The turning-off of switch S isolates capacitor C2 of node B. Capacitor C2 exhibits across its terminals a voltage UC2, which will remain constant since the gate of transistor MN1 absorbs no current. Since voltage UC2 remains constant, current I2 crossing current source 16 will remain constant and strictly equal to the value of current I1 at time t0. Circuit 18 thus acts as a means for storing the value of current I1 before turning-on of one of transistors M1 and M3. Preferably, time t0 will be chosen to be as close as possible to time t1, for the storage of current I1 to be performed on a value of I1 as close as possible to the time when the charge pump communicates with the loop filter. It should be reminded that, although current I1 is, in principle, a constant current, current I1 is altered by noise. Current I1 is thus submitted to variations which may certainly be small, but introduce noise at the output of the phase-locked loop when the charge pump communicates with the loop filter.

It should here be noted that capacitor C2 can be omitted. Indeed, the value of this capacitor is small, typically on the order of 5 picofarads. If transistor MN1 is formed so that its gate-source stray capacitance is sufficient, for example by means of a transistor of sufficient dimensions, the stray capacitance of transistor MN1 may be used as a capacitor C and said capacitor may be suppressed.

At time t1, signal U switches to "1". This results in turning on transistor M1 and turning off transistor M2. Current I1 reaching node A is then directed towards output OUT and injected into the loop filter to decrease the phase deviation between signals Fdiv and Fcomp. Between times t1 and t2, signal D remains equal to "0". Transistor M3 thus remains off, and transistor M4 remains on. Current I2 running through current source 16 is provided by capacitor C1, which discharges at constant current through transistors M4 and MN1. The value of voltage UC2 does not substantially vary between times t1 and t2, and current I2, between times t1 and t2, remains equal to the value of current I1 at time t0. The capacitance of capacitor C1 is chosen to be sufficiently large to be able to provide current I2 for a sufficient duration corresponding to the phase deviation between Fdiv and Fcomp. A typical value of the capacitance of capacitor C1 is approximately 30 picofarads.

At time t2, signal D switches to "1", signals U and AZ remaining at "1". Then, transistor M3 turns on and transistor M4 turns off. Current source 16 then is in connection with output OUT, and the current transiting through output OUT is equal to current I1 provided by source 14 at time t2 decreased by current I2 equal, as it should be reminded, to current I1 provided by source 14 at time t0. Since the time interval between t2 and t0 is small, the value of current I1 has varied little between these two times. Thereby, it can be considered that the source of I1 is altered by a noise that can be decomposed in a low-frequency noise and a high-frequency noise. Between times t0 and t2, only the high-frequency noise of current I1 has varied. The low-frequency noise having been memorized at time to by current I2, the current provided at output OUT is devoid of the low-frequency noise altering source I1, which is a considerable advantage with respect to prior art. The closest time t0 is to time t1, the better the noise elimination and the smaller the residual current transiting through output OUT. Thus, it will be advantageous to have switch S turn off as close as possible to time t1.

At time t3, signals U and D both switch to "0", signal AZ remaining at "1". In this case, transistors M1 and M3 turn off and transistors M2 and M4 turn on. Current I1 reaching A is directed to node B. Capacitance C1 having discharged during step t1–t2, to return to equilibrium, a portion of current I1 will be used to recharge it.

At time t4, signal AZ switches to "1" and switch S turns on. This situation is similar to that preceding time t0, signals U, D, and AZ all being equal to "0". When equilibrium is reached, capacitors C1 and C2 are charged, and current I2 is strictly equal to current I1. Time t4 is chosen so that the switches of the first and second pair of switches have had time to switch. Time t4 can be chosen within a relatively large time range.

When the loop is stabilized (after time t'0), only the high-frequency noise altering current sources 14 and 16 is transmitted during time t'3–t'1.

Thus, in the present invention, circuit 18 is a control circuit of current source 16, which ensures that current I2 running through current source 16 follows the variations of current I1 running through current source 14. Before the charge pump provides current on its output OUT, means 18 memorizes the value of current I1 and, when both current sources 14 and 16 communicate with output OUT, the value of current I2 provided by current source 16 is equal to the stored value of current I1. As compared to prior art, this enables, on the one hand, reducing the residual current I1–I2 provided at the charge pump output when each of these sources communicates with the loop filter, and on the other hand suppressing the low-frequency noise in the current provided by the charge pump.

Another advantage of the charge pump according to the present invention is that it is easily integrable. It can use smaller transistors and consumes less than in prior art. To have a good matching on the current mirrors and to have a small low-frequency noise, large transistors must conventionally be provided. Since, according to the present invention, a memorization is performed, which suppresses the low-frequency noise and interval I1–I2, transistors MP1, MP2, and MN1 smaller than in prior art can be used. Further, conventionally, to decrease the low-frequency noise in the loop, the current of sources I1 and I2 is increased (the noise of a MOS transistor increases as $\sqrt{I}$ but the gain of this noise towards the output is a $1/I$ function). Since the low-frequency noise is suppressed, the value of the current can be decreased. Factor Iref-I1 also is a reason of the consumption decrease.

Of course, the present invention is likely to have various alterations, modifications, and improvements which will readily occur to those skilled in the art.

The case where voltage VDD is a positive supply voltage and voltage VSS is a supply voltage equal to 0 (ground voltage) has been described. Of course, voltage VSS may be different, for example, negative with respect to the circuit ground. Also, the polarities of voltages VDD and VSS may be inverted. In this case, the N-type transistors will be replaced with P-type transistors, and vice-versa.

Also, the MOS transistors of the described embodiment may, if desired, be replaced with bipolar transistors, but, in this case, current source 16 will have to be formed so that it only takes a negligible current from its control terminal, so that the voltage on its control terminal, if current source 16 is voltage-controlled, remains at a constant value.

Finally, switch S has not been specifically described. Of course, it may be any appropriate switch device, for example, a MOS transistor, appropriately connected and controlled.

Having thus described at least one illustrative embodiment at the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A charge pump for a phase-locked loop including a first current source, a second current source, several switches adapted to enabling communication of the first and/or the second current source with the charge pump output, wherein the second current source is controlled by a control means adapted to storing a variable corresponding to the value of the current provided by the first current source, so that the value of the current provided by the second current source is substantially equal to the value of the current provided by the first current source, the control means comprising a first branch comprising a first storing means and a second branch comprising a second storing means, wherein the first current source is connected between a first supply voltage and a first node, and wherein the switches include:

a first switch connected between the first node and the charge pump output, controlled by a first control signal, a second switch connected between the first node and a second node, controlled by the inverse of the first control signal, a third switch connected between the output of the charge pump and a third node, controlled by a second control signal, a fourth switch connected between the second node and the third node, controlled by the inverse of the second control signal, and wherein the second current source is connected between the third node and a second supply voltage.

2. The charge pump of claim 1, wherein the first switch is formed of a third transistor of the second conductivity type, the second switch is formed of a fourth transistor of the second conductivity type, the third transistor is formed of a fifth transistor of the first conductivity type, and the fourth transistor is formed of a sixth transistor of the first conductivity type.

3. The charge pump of claim 1, wherein the first supply voltage is a positive voltage, the second supply voltage is the ground voltage, and the transistors of the first conductivity type are N-channel MOS transistors and the transistors of the second conductivity type are P-channel MOS transistors.

4. The charge pump of claim 1, wherein the first branch includes a first capacitor coupled to the second node.

5. The charge pump of claim 1, wherein the second branch includes a fifth switch connected between the second node and the output of the control means.

6. The charge pump of claim 5, wherein the second branch includes a second capacitor coupled to the second node via the fifth switch.

7. A charge pump for a phase-locked loop including a first current source, a second current source, several switches adapted to enabling communication of the first and/or the second current source with the charge pump output, wherein the second current source is controlled by a control means adapted to storing a variable corresponding to the value of the current provided by the first current source, so that the value of the current provided by the second current source is substantially equal to the value of the current provided by the first current source, the control means comprising a first branch comprising a first storing means and a second branch comprising a second storing means, wherein the second branch includes a fifth switch connected to the output of the control means.

8. The charge pump of claim 7, wherein the second branch includes a second capacitor coupled to the fifth switch.

* * * * *